United States Patent
Reitzle et al.

(10) Patent No.: US 9,819,061 B2
(45) Date of Patent: Nov. 14, 2017

(54) METHOD FOR DETERMINING THE TEMPERATURE OF A BATTERY

(71) Applicant: Robert Bosch GmbH, Stuttgart (DE)

(72) Inventors: Alexander Reitzle, Neu-Ulm (DE); Sarmimala Hore, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/309,688

(22) PCT Filed: Apr. 13, 2015

(86) PCT No.: PCT/EP2015/057925
§ 371 (c)(1),
(2) Date: Nov. 8, 2016

(87) PCT Pub. No.: WO2015/172953
PCT Pub. Date: Nov. 19, 2015

(65) Prior Publication Data
US 2017/0133729 A1    May 11, 2017

(30) Foreign Application Priority Data
May 12, 2014 (DE) .................. 10 2014 208 865

(51) Int. Cl.
*G01K 13/00* (2006.01)
*H01M 10/48* (2006.01)
(Continued)

(52) U.S. Cl.
CPC .......... *H01M 10/486* (2013.01); *G01K 13/00* (2013.01); *G01R 31/362* (2013.01);
(Continued)

(58) Field of Classification Search
USPC ......................... 374/152, 163, 141
See application file for complete search history.

(56) References Cited

U.S. PATENT DOCUMENTS

| 6,902,319 B2 | 6/2005 | Wu et al. |
| 7,896,543 B2* | 3/2011 | Asada ............... G01K 1/16 320/150 |

(Continued)

FOREIGN PATENT DOCUMENTS

| DE | 102007061130 | 7/2008 |
| JP | 2007178215 A | 7/2007 |
| KR | 20030038992 A | 5/2003 |

OTHER PUBLICATIONS

International Search Report for Application No. PCT/EP2015/057925 dated Jul. 8, 2015 (English Translation, 2 pages).

*Primary Examiner* — Mirellys Jagan
(74) *Attorney, Agent, or Firm* — Michael Best & Friedrich LLP

(57) ABSTRACT

The invention relates to a method for determining the temperature of a battery, comprising the following steps: a) determining the state of charge of at least one battery cell; b) determining a change in the open-circuit voltage ($V_{L1}$, $V_{L2}$) of the at least one battery cell immediately after the end of the flow of an electric current ($I_L$, $I_E$) through the at least one battery cell; and c) determining the temperature of the at least one battery cell on the basis of the state of charge and the change in the open-circuit voltage ($V_{L1}$, $V_{L2}$). The method described above economically enables especially reliable operation of the battery that is stable over the long term.

10 Claims, 1 Drawing Sheet

(51) Int. Cl.
*G01R 31/36* (2006.01)
*H01M 10/0525* (2010.01)
*H01M 10/052* (2010.01)

(52) U.S. Cl.
CPC ....... *H01M 10/0525* (2013.01); *H01M 10/48* (2013.01); *H01M 10/052* (2013.01); *H01M 2220/20* (2013.01)

(56) References Cited

U.S. PATENT DOCUMENTS

| | | |
|---|---|---|
| 2004/0128086 A1 | 7/2004 | Barsoukov et al. |
| 2006/0261782 A1* | 11/2006 | Kim ............... H01M 10/44 320/132 |
| 2008/0150457 A1 | 6/2008 | Salman et al. |
| 2011/0299564 A1 | 12/2011 | Leutheuser et al. |
| 2012/0099618 A1* | 4/2012 | Nishi ............... G01K 7/42 374/152 |
| 2012/0109554 A1 | 5/2012 | Lin et al. |
| 2012/0136594 A1* | 5/2012 | Tang ............... G01R 31/3679 702/63 |
| 2013/0108904 A1* | 5/2013 | Okabayashi ........ H01M 10/486 429/90 |
| 2013/0166235 A1* | 6/2013 | Oh ............... G01R 31/3624 702/63 |
| 2013/0322488 A1 | 12/2013 | Yazami et al. |
| 2015/0153420 A1* | 6/2015 | Adaniya ........... H01M 10/48 702/63 |

* cited by examiner

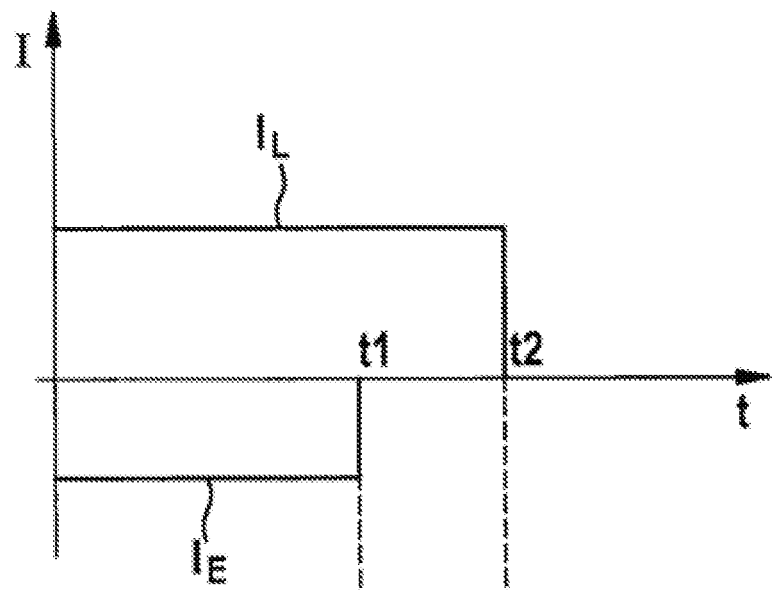
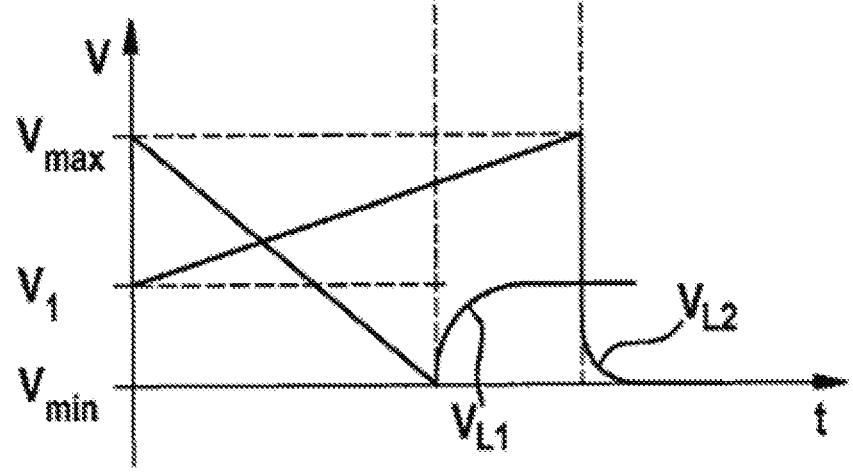

METHOD FOR DETERMINING THE TEMPERATURE OF A BATTERY

BACKGROUND OF THE INVENTION

The present invention relates to a method for determining the temperature of a battery. The invention relates particularly to a method for determining the temperature with improved accuracy by precisely determining the cell temperature.

Electrochemical energy stores, such as, for example, lithium-ion batteries, are widely used in many daily applications. Said electrochemical energy stores are, for example, used in computers, such as laptops, mobile telephones, smartphones and other applications. Such batteries also offer advantages in the electrification of vehicles, such as motor vehicles, which is presently being greatly advanced.

The operating temperature of batteries respectively of battery cells is often an important operating parameter. For example, the temperature can have a great influence on the efficiency and durability of the battery because the efficiency and durability of the batteries can be reduced when temperatures are increased. Hence, the measuring of the operating temperature of batteries, such as lithium-ion accumulator batteries, is important for the operation of the batteries.

The American patent publication U.S. Pat. No. 6,902,319 B2 describes a method for estimating an internal temperature of a vehicle battery based on a heat transfer between a heat source and the battery.

A method for estimating the core temperature of a cell in a battery is known from the American patent publication US 2012/0109554 A1. In such a method, two estimates are carried out, a weighting factor is used and subsequently the core temperature is estimated by means of a function of the weighted first and second estimate.

SUMMARY OF THE INVENTION

The subject matter of the present invention is a method for determining the temperature of a battery, comprising the following steps:
  a) determining the state of charge of at least one battery cell;
  b) determining a change in the open-circuit voltage of the at least one battery cell immediately after the end of the flow of an electric current through the at least one battery cell; and
  c) determining the temperature of the at least one battery cell on the basis of the state of charge and the change in the open-circuit voltage.

The method described above enables the temperature of a battery to be determined in a particularly exact and cost effective manner. In so doing, the temperature of a battery cell or a plurality of battery cells is determined in detail during a determination of the temperature of the battery.

The method described above is therefore used to determine the temperature of a battery cell and thus the temperature of a battery. The temperature of a battery plays a significant role during the operation of the battery. This can, for example, be based on the fact that, if the battery is overheated, a so-called thermal runaway can pass through said battery. Overheating can thereby occur, for example, by means of an internal cell defect or also by means of an external temperature influence.

Such a case of failure, as this is generally known, can particularly take place inside of the battery cell and, in so doing, proceed in a plurality of steps, wherein each of the elapsing steps can cause comparatively large damage. If overheating occurs, damage or a breakdown can, for example, occur to an electrolyte layer disposed on the anode or respectively to a protective layer disposed between electrolyte and anode, whereby electrolyte constituents comprising anode materials, such as, for example, carbon, can react exothermically, which can further increase the temperature of the cell. In so doing, such exothermal processes, for example the processes taking place on the anode, can further accelerate, wherein the heat produced in this manner can decompose somewhat organic solvents, which, for example, may be present in the electrolyte. This can in turn lead to inflammable gases, such as, for example, ethane, methane or other hydrocarbons being able to be released. The development of such gases as a result of the decomposition of the electrolyte, can, for example, further cause a pressure increase in the interior of the cell, which can cause further damage.

It is clear from the above that an exact temperature measurement for a reliable operation of a battery and furthermore for a sufficient durability of the battery is of great interest.

In order to achieve this, the method described above comprises according to step a) of the method determining the state of charge of at least one battery cell. The step of the method can take place in a manner known per se by means of a battery control system as said system is generally known by a person skilled in the art. The state of charge of a battery is also denoted as SOC and can, for example, be determined in a non-restrictive manner by observing the battery voltage because this often correlates with the state of charge. Furthermore, the flowing current can, for example, be integrated over the time or a Kalman filter can be used. Determining the state of charge of the at least one battery cell is however not limited to the methods described above. In so doing, the state of charge of all of the battery cells can be determined, or the state of charge of each or of individual cells of the plurality of battery cells connected, for example, in series can be determined according to step a) of the method. The use of the state of charge of the battery cell or the plurality of battery cells can thus, for example, be an advantage for the present method because the state of charge during an operation of the battery is often measured in any case and therefore the existing technical requirements are provided in any case in a battery control system. In addition, the state of charge provides a possible parameter for determining the temperature of the at least one battery cell, as this is subsequently explained.

According to step b) of the method, the present method furthermore comprises determining a change in the open-circuit voltage of the at least one battery cell immediately after the end of the flow of an electric current through the at least one battery cell. In this step of the method, it is thus determined how the open-circuit voltage ($V_{oc}$) of the battery cell changes after the end of the flow of a current, which, for example, can be implemented by switching off the battery cell, for example, by disconnecting an electrical connection or switching off all of the consumers. It can be determined in detail that, if a flowing current is interrupted, a change in the open-circuit voltage can be determined at substantially all of the states of charge. If, for example, a discharge current is used for a certain period of time, wherein the open-circuit voltage drops during the course of time as a result of the discharge, a drift of the open-circuit voltage can be observed upon ending the discharge current, for example when disconnecting the cell, immediately after the end of the current. In this case, a voltage increase in the open-circuit voltage can be observed in detail. On the other hand, in the case of a charge current of the battery or respectively the cell for a certain period of time and thus a voltage increase over time immediately after the end of the charge current, for example by disconnecting the cell, a drift of the open-circuit voltage can in turn be determined, wherein the open-circuit voltage drops after the end of the charge current.

The open-circuit voltage can be determined in a manner known per se by, in the case, for example, of one cell or a plurality of cells, the flow of a current through the cell or the cells being ended and the voltage being measured at the corresponding open poles. In so doing, the voltage is measured particularly over an extended period of time in order to determine the change in the voltage or respectively the voltage drift.

According to the further step c) of the method, said method furthermore comprises determining the temperature of at least one battery cell and consequently of the battery on the basis of the state of charge and the change in the open-circuit voltage. This step of the method is particularly based on the fact that the previously described drift of the open-circuit voltage after the end of a flowing current, whether it relates to a discharge current or a charge current, is particularly dependent on the state of charge and the temperature of the at least one battery cell. The method according to the invention is thus based on the fact that, in the case of a known or respectively constant state of charge and a temperature that changes, the change in the open-circuit voltage after the end of the flow of a current likewise changes in accordance with the change in temperature. The increase or decrease in the open-circuit voltage can thus indicate a need for determining the temperature of the battery cells.

In so doing, the temperature of one or a plurality of battery cells can be separately determined for the case that the open-circuit voltage of this battery cell or these battery cells was in each case determined individually; or an averaged temperature of a plurality of battery cells can be determined if the open-circuit voltage of these battery cells, which are particularly connected in series, was jointly determined.

The method described above for determining the temperature of a battery thus allows for the temperature of the battery to be determined in an indirect manner by using the state of charge and a change in the open-circuit voltage of at least one battery cell. In so doing, the method described above has significant advantages in comparison to the measuring method known from the prior art.

By means of the method described above, the temperature of a battery can be particularly exactly measured, because particularly an inference can be made about the temperature which forms in the inside of a battery cell or respectively in a plurality of battery cells. This can therefore especially be important because the temperature of a battery, if it, for example, is determined on the outside of a battery housing, does not always correspond to the value present in the interior of the battery. In particular in the case of a fault, which is based on an increased temperature, a very quick response may furthermore be required in order to prevent greater damage from occurring. By virtue of the fact that the temperature in the interior of the cell can be immediately determined, a particularly dynamic response can be initiated because a temperature increase in the interior of the cell can often only be determined with a time delay in the case of a sensor disposed on the outside of a housing.

In addition, the method described above can be implemented with a reduced number of temperature sensors or temperature sensors can be completely eliminated. As a result, the method described above enables on the one hand a significant cost savings. This results from the fact that the costs for the sensors can be saved. Furthermore, the present method can substantially be carried out without further cost intensive components. In contrast hereto, the method described above can be carried out in a simple manner with measurement data that can be easily determined, in particular by means of the battery control system; thus enabling the method to be implemented with low costs in existing systems.

Reducing the number of temperature sensors has furthermore the further advantage that weight can be saved. This can especially be of great advantage in mobile applications, such as, for example, in electrically driven vehicles.

In addition, the service life of a battery can thereby be increased because the absence of additional active parts always means reduced maintenance and furthermore a reduced potential for damage.

In summary, a method as described above for determining the temperature of a battery thus allows for a particularly cost effective and reliable operation and furthermore a particularly long service life of the battery.

Within the scope of one configuration, step c) of the method can be carried out using a temporal change in the open-circuit voltage or respectively using a change in a time constant of the change in the open-circuit voltage or using the entire profile of the change in the open-circuit voltage. In this configuration, if the time constant ($\tau$) of the drift is determined and is used for the present invention, the change in the open-circuit voltage can thus particularly be determined as a function of the time and evaluated. In this configuration, an exact acquisition of the temperature may already be possible because a time constant is often already dependent on the present temperature and thus may already allow for an exact measurement result of the temperature. A time constant refers in this case particularly to a characteristic variable of the change in the open-circuit voltage, which relates to the pure time duration of the change up to a constancy in the open-circuit voltage or to the time duration $t=T1/e$ which the change in the open-circuit voltage as a frequently exponentially falling or rising process requires, in order to fall to $1/e$ of the initial value or to rise by this amount. In this process, T denotes temperature.

Furthermore, it is however also possible to consider the entire profile of the change in the open-circuit voltage in addition to a purely temporal change in the open-circuit voltage. When observing the entire profile, the strength of the change in the open-circuit voltage can at least also be taken into consideration besides a temporal component. Particularly this configuration can thus enable a particularly exact determination of the temperature of the battery cell or the plurality of battery cells.

Within the scope of a further configuration, the method can be carried out by a battery control system. Such a system, which is also denoted as a battery management system, is often present in any case to operate a battery. In so doing, the battery control system does not need any expensive constructions or rearrangements in order to be able to carry out the present method because the parameters used with the present invention, such as the open-circuit voltage and the state of charge, can mostly be easily measured within the scope of an operation of the battery. As a result, only a suitable command has to be introduced into the control system, by means of which the temperature can be detected on the basis of the aforementioned parameters.

Within the scope of a further configuration, step c) of the method can be carried out on the basis of a data set, in particular of a data set deposited in the battery control system. In this configuration, the present invention can be especially easily implemented in a battery control system. In a very simple manner, this requires only that data be entered into the memory of a battery control system and stored there, said data assigning parameters to a temperature with regard to a drift of an open-circuit voltage at defined states of charge. Such a data set can be easily created because, due to the known dependencies, the corresponding parameters are obtainable by mere tests. The battery control system can then easily assign said parameters to a temperature when determining the state of charge for the given cell or for a plurality of cells.

Within the scope of a further configuration, the determined temperature can be verified by the use of a temperature sensor. In this configuration, the temperature is particularly reliably determined. This is due to the fact that it has been excluded to the greatest possible extent that the dependency of the temperature on the state of charge has changed in the interior of the cell as, for example, a result of damage or ageing effects. A temperature sensor can, for example, be present at a straightforward position of the battery and thereby facilitate a calibration of the temperature determined by means of the temperature sensor as well as the temperature determined by means of the method described above. In so doing, it can be determined whether a corresponding correlation of the two temperature values remains the same or has changed. In this way, a correct temperature measurement can be ensured even after a long working time of the battery.

Within the scope of a further configuration, the change in the open-circuit voltage can be determined cyclically. In this configuration, the change in the open-circuit voltage can therefore be determined in order to monitor an even longer-term operation of the battery. To this end, cyclically individual cells of a plurality of cells can, for example, be separated from the consumer in order to prevent such a current flow through the cell. This can allow the required parameters to be determined. In the process, the temperature of the battery can furthermore be correspondingly cyclically determined on the basis of the change in the open-circuit voltage, wherein the state of charge of the battery cell or the battery cells can be estimated or likewise correspondingly cyclically determined.

In this configuration, the temperature of the battery can thus be determined not only when the entire battery is switched off or respectively shut down but also then if a consumer continues to be supplied with energy, particularly in the case of a module comprising a plurality of battery cells. In the exemplary case of an electrically driven vehicle, this can, for example, mean that the temperature of the battery can also then be determined if the vehicle continues to be operated. In this configuration, the operation of an electrically supplied component can thus be particularly reliably designed.

Within the scope of a further configuration, the change in the open-circuit voltage can be determined during a recuperation phase of the battery. During the recuperation phase, respectively feedback phase by means of recuperating current, in this configuration, said current can temporarily be diverted across a resistor and the open-circuit voltage can be measured in this period of time. In the case of a vehicle, theoretically at any point in time in which the vehicle is not accelerated, the temperature can, for example, be determined here from the profile of the open-circuit voltages of the cell or respectively the cells. In a practical sense, this type of determination of the open-circuit voltage cannot be carried out at every possible chance but, for example, after certain time intervals or after the application of certain current loads, such as high charge or discharge loads over an extended period of time.

Within the scope of a further configuration, the battery can be a lithium-ion battery. In this configuration, the temperature measuring method described above can be implemented in a clear and effective manner. In detail, the drift of the open-circuit voltage can be a consequence of the inhomogeneity of the diffusion constant in various electrode materials: in the case of the lithium-ion battery, for example of composite materials comprising nickel (Ni), cobalt (Co), magnesium (Mg) {NiCoMg} or comprising nickel (Ni), manganese (Mn), aluminum (Al) {NiMnAl}, cobalt based oxides or manganese based oxides. The drift can furthermore be a consequence of a change in the composition in the cathode or the anode. In the case of a lithium-ion battery, the anode can, for example, in the case that said anode comprises carbon, for example in the form of graphite, or silicon-tin-carbon composite materials or pure silicon, form various phases of $Li_xC$, wherein x represents the amount of intercalated lithium. In this regard, the aforementioned formation of different phases is not reduced to carbon but can also occur in further materials, for example in electrodes that comprise titanium. If the current flow is terminated, an intrinsic change in the diffusion of lithium ions ($Li^+$) can occur as a result of the change in the diffusion constant of lithium-ions ($Li^+$) as a consequence of the inhomogeneity of the composition of the electrode materials.

With respect to further technical features and advantages of the method according to the invention, reference is made here explicitly to the explanations in connection with the battery system according to the invention, the FIGURE as well as the description of the FIGURE.

The subject matter of the present invention is furthermore a battery system which is designed to carry out a method designed as previously described. Such a battery system correspondingly comprises a battery, which has at least one battery cell for supplying a consumer with electrical power. The battery can, for example, be a lithium-ion battery. In order to be able to carry out the method described above, the battery system or respectively the battery first of all comprises a means for determining the state of charge of at least one battery cell. This can, for example, be the battery control system, which can determine the state of charge on the basis of determined parameters, as this is generally known by persons skilled in the art.

The battery system furthermore comprises a means for determining a change in the open-circuit voltage of the at least one battery cell immediately after the end of the flow of an electric current through the at least one battery cell. In a manner known per se, this can be a voltage meter, which, for example, can determine the voltage at both poles of the battery cell.

Finally, the battery system comprises a means for determining the temperature of the at least one battery cell on the basis of the state of charge and the change in the open-circuit voltage. This means can in turn be the battery control system, which determines the temperature of the at least one battery cell or respectively battery using the determined data and, for example, a data set deposited in a memory.

With regard to the concrete configuration of the aforementioned means, reference is furthermore made to the description above of the method for determining the temperature of the battery.

The previously described battery system allows the temperature of a battery cell or respectively the battery to be determined in a particularly simple and cost effective manner and in so doing in a particularly precise manner. Along with this, a particularly cost effective and reliable operation and furthermore a particularly long service life of the battery is assured.

With regard to further technical features and advantages of the battery system according to the invention, reference is made here explicitly to explanations in connection with the method according to the invention, to the FIGURE as well as to the description of the FIGURE.

BRIEF DESCRIPTION OF THE DRAWINGS

Further advantages and advantageous configurations of the subject matters according to the invention are illustrated by means of the drawing and explained in the subsequent detailed description. It should thereby be noted that the drawing has only a descriptive character and is not intended to limit the invention in any way. In the drawing:

FIG. 1 shows a schematic depiction which explains the method according to the invention.

DETAILED DESCRIPTION

A diagram is shown in FIG. 1, which shows the change in the open-circuit voltage $V_{L1}$, $V_{L2}$ (lower region) after the end of the flow of a current $I_L$, $I_E$ (upper region) at a given temperature and a given state of charge of a battery, such as, for example, a lithium-ion battery.

The diagram of FIG. 1 shows in detail the profile of the voltage V and the current I versus the time t. It can thereby be seen that if a charging process (charge current $I_L$) or also a discharging process (discharge current $I_E$) is ended approximately at the times t1 or t2, a change in the open-circuit voltage $V_{L1}$, $V_{L2}$ can be determined as a function of the time at all of the values of the state of charge. In reference to FIG. 1, a discharge current $I_E$ is used for a period of time up to a point in time t1, wherein a drop in the voltage V occurs, and in fact from a maximum voltage $V_{max}$ to a minimum voltage $V_{min}$. A disconnection of the cell and therefore the end of the flow of the discharge current $I_E$ at a point in time t1 results then in a voltage drift of the open-circuit voltage $V_{L1}$, which results according to FIG. 1 in an increase in the open-circuit voltage $V_{L1}$ to the value $V_1$ by the amount of ($V_1-V_{min}$). If, on the other hand, the battery is charged by using a charge current $I_L$, the voltage increases from the voltage $V_1$ to the maximum voltage $V_{max}$. If the cell is disconnected at a point in time t2, the open-circuit voltage $V_{L2}$ drops to a value $V_{min}$.

The drift of the open-circuit voltage $V_{L1}$, $V_{L2}$ shown in FIG. 1 can thus be used to indicate the temperature, wherein a time constant of the change in the open-circuit voltage $V_{L1}$, $V_{L2}$ or the entire profile of the change in the open-circuit voltage $V_{L1}$, $V_{L2}$ can be used.

In this way, the temperature of the at least one battery cell can be determined on the basis of the state of charge and the change in the open-circuit voltage $V_{L1}$, $V_{L2}$, for example, by a battery control system and, for example, on the basis of a data set especially deposited in the battery control system when determining the state of charge of at least one battery cell and when determining a change in the open-circuit voltage $V_{L1}$, $V_{L2}$ of the at least one battery cell after the end of the flow of an electric current $I_L$, $I_E$ through the at least one battery cell.

The invention claimed is:

1. A method for determining the temperature of a battery, comprising the following steps:
    a) determining the state of charge of at least one battery cell;
    b) determining a change in an open-circuit voltage ($V_{L1}$ or $V_{L2}$) of the at least one battery cell immediately after the end of the flow of a respective electric current ($I_E$, $I_L$) through the at least one battery cell; and
    c) determining the temperature of the at least one battery cell on the basis of the state of charge and the change in the open-circuit voltage ($V_{L1}$ or $V_{L2}$).

2. The method according to claim 1, wherein the determined temperature is verified by the use of a temperature sensor.

3. The method according to claim 1, wherein the change in the open-circuit voltage ($V_{L1}$, $V_{L2}$) is determined cyclically.

4. The method according to claim 1, wherein the change in the open-circuit voltage ($V_{L1}$, $V_{L2}$) is determined during a recuperation phase of the battery.

5. The method according to claim 1, wherein the battery is a lithium-ion battery.

6. The method according to claim 1, wherein step c) of the method is carried out using a temporal change in the open-circuit voltage ($V_{L1}$, $V_{L2}$).

7. The method according to claim 6, wherein step c) of the method is carried out using an entire profile of the change in the open-circuit voltage ($V_{L1}$, $V_{L2}$).

8. The method according to claim 1, wherein the method is carried out by means of a battery control system.

9. The method according to claim 8, wherein step c) of the method is carried out on the basis of a data set that is stored the battery control system.

10. A battery system comprising a battery having at least one battery cell, the system comprising:
    a means for determining the state of charge of the battery cell,
    a means for determining a change in an open-circuit voltage ($V_{L1}$ or $V_{L2}$) of the at least one battery cell immediately after the end of the flow of a respective electric current ($I_E$, $I_L$) through the at least one battery cell, and
    a means for determining the temperature of the at least one battery cell on the basis of the state of charge and the change in the open-circuit voltage ($V_{L1}$ or $V_{L2}$).

* * * * *